United States Patent [19]
Yamazaki

[11] Patent Number: 6,057,234
[45] Date of Patent: May 2, 2000

[54] METHOD FOR FABRICATING SEMICONDUCTOR DEVICE

[75] Inventor: Shunpei Yamazaki, Tokyo, Japan

[73] Assignee: Semiconductor Energy Laboratory Co., Ltd., Kanagawa-ken, Japan

[21] Appl. No.: 08/845,804

[22] Filed: Apr. 24, 1997

[30] Foreign Application Priority Data

Apr. 29, 1996 [JP] Japan .................................. 8-132873

[51] Int. Cl.$^7$ .................................................. H01L 21/44
[52] U.S. Cl. ........................... 438/660; 438/662; 438/686
[58] Field of Search ..................... 438/631, 697, 438/699, 713, 743, 789, 660, 662, 686

[56] References Cited

U.S. PATENT DOCUMENTS 5,002,464  3/1991  Lee .......................................... 417/152
5,693,541  12/1997  Yamazaki et al. ....................... 438/486
5,779,925  7/1998  Hashimoto et al. ...................... 216/67

Primary Examiner—David Nelms
Assistant Examiner—Reneé R. Berry
Attorney, Agent, or Firm—Fish & Richardson P.C.

[57] ABSTRACT

There are disclosed apparatus and method for well performing a reflow step that reduces malfunctions of TFTs due to defective contacts. The apparatus has at least first and second hermetic reaction chambers whose ambients can be controlled independently. These two chambers are connected together hermetically. In the first chamber, a film consisting only or chiefly of aluminum is formed by sputtering. In the second reaction chamber, a heat treatment is performed to impart fluidity to at least a part of the film consisting only or chiefly of aluminum.

71 Claims, 11 Drawing Sheets

METHOD FOR FABRICATING SEMICONDUCTOR DEVICE

BACKGROUND OF THE INVENTION

1. Field of the Invention

The present invention relates to techniques for forming contacts to electrodes or conductive interconnects consisting only or chiefly of aluminum, and the active layer of TFTs to make conductive interconnects.

2. Description of the Related Art

In recent years, techniques for fabricating thin-film transistors (TFTs) on cheap glass substrates have evolved rapidly, because there is an increasing demand for active matrix liquid crystal displays.

An active matrix liquid crystal display has millions of pixels arranged in rows and columns. TFTs are arranged at these pixels. Electric charge going into and out of each electrode at the pixels is controlled by the switching action of the TFTs.

An integrated circuit comprising a substrate on which both a display pixel portion and a driver circuit portion are formed has enjoyed general acceptance. Circuit TFTs for driving the pixel TFTs are incorporated in the peripheral driver circuit. The display pixel portion consists of a liquid crystal along with the pixel electrodes.

As mentioned above, an integrated circuit for an active matrix liquid crystal display is composed of as many as millions of pixel TFTs and hundreds of circuit TFTs. Therefore, the production yield is inevitably low.

For example, if one pixel TFT fails to operate, then pixel electrodes connected with this defective TFT do not operate as display elements. This gives rise to a so-called point defect. For example, in the case of a normally black liquid crystal display, when white is produced on the display device, a point defect appears as a black point, which is deeply harmful to the appearance.

Also, if any circuit TFT fails to operate, all the pixel TFTs applied with a drive voltage from this faulty TFT fail to act as switching elements. This results in a so-called line defect and is a fatal hindrance to the liquid crystal display.

Accordingly, in an active matrix liquid crystal display, millions of TFTs must operate normally and stably over a long term. However, the present situation is that it is difficult to exhaustively eliminate point defects and line defects. One of the causes is defective contact.

The defective contact is a defective operation when an interconnect electrode is electrically poorly connected with a TFT at a contact site. Especially, in the case of a planar TFT, defective contact presents serious problems, because an interconnect electrode is electrically connected with a TFT through a thin contact hole.

Defective contact is a main cause of early stage deterioration of semiconductor device characteristics. Especially, where large currents flow or the device is operated at high temperatures, the deterioration is promoted. Therefore, it is reasonably said that the reliability of contacts determines the reliability of the semiconductor device.

Generally, in the case of pixel display regions of an active matrix liquid crystal display, source electrodes are brought directly out of the pixel display regions and so there exist only contacts for connection with the semiconductor layer of the TFT.

In the case of a peripheral driver circuit, there are tens of thousands to millions of contacts. Especially, because there exist gate electrode contacts, and because the temperature is elevated by large-current operation, the contacts must have higher reliability than the pixel display regions.

The causes of defective contacts are classified into three major categories.

The first category is that a conductive film forming interconnect electrodes is not in ohmic contact with a semiconductor film forming the source/drain regions of TFTs.

This is caused by formation of an insulating coating such as a metal oxide at the junction plane. Also, the states in the vicinities of the semiconductor film surface (doping concentration, defect level density, level of cleanliness, and so on) greatly affect the performance of the contacts.

The second category is that the conductive film forming the interconnect electrodes has poor coverage and thus the metal lines break within contact holes. In this case, it is necessary to improve the situation by the method of forming the interconnect electrodes or by film growth conditions.

The third category is that an interconnect electrode breaks due to the cross-sectional shape of the contact hole. The cross-sectional shape of the contact hole depends heavily on the conditions under which the insulators (SiN, $SiO_2$, etc.) covered with the contact portions are etched.

Especially, recessing caused by overetching and blowholes severely deteriorate the coverage and thus pose great problems. The manner in which a gate electrode is recessed is described by referring to FIG. 14.

FIG. 14 is an enlarged view of a contact hole portion that permits a gate electrode of a planar TFT to make contact with conductive interconnects.

In FIG. 14(A), a gate electrode 11 is made from a metallization material that can be anodized. In this embodiment, this metallization material consists chiefly of aluminum (Al). For simplicity, a gate insulator film, a semiconductor layer, and so on existing under the gate electrode 11 are omitted in the figure.

An anodic oxide film 12 is formed by anodizing the gate electrode 11 within an electrolyte. This anodic oxide film consists mainly of $Al_2O_3$.

This anodic oxide film 12 is very dense and firm and protects the gate electrode 11 from heat produced during thermal treatment. Hence, formation of hillocks and whiskers is suppressed.

An interlayer dielectric film 13 is formed on the gate electrode 11. A silicide film such as silicon oxide film, silicon nitride film, or silicon oxynitride film can be used as the interlayer dielectric film 13.

Then, the interlayer dielectric film 13 is etched by wet etching or dry etching to form a contact hole 14. For this purpose, the interlayer dielectric film 13 consisting of a silicide film must be first etched, followed by etching of the anodic oxide film 12.

However, the anodic oxide film 12 is very dense and firm and so it takes a considerable time to perform the etching. Therefore, the etching progresses considerably laterally, thus forming a recessed portion 15 as shown in FIG. 14(B).

Under this condition, an interconnect electrode 16 is deposited. This state is shown in FIG. 14(C). As can be seen from this figure, the interconnect electrode 16 cannot cover the recessed portion. This can cause breaks in metal lines.

If overetching is prolonged at the end of the etching of the anodic oxide film, the etching of the gate electrode 11 progresses slowly. This may result in blowholes. Also in this case, there arises the problem that metal lines break.

SUMMARY OF THE INVENTION

It is an object of the present invention to provide apparatus and method for performing processing operations well to reduce faulty operations of TFTs due to defective contacts by solving the foregoing problems.

One main aspect described herein solves the foregoing problem and resides in an apparatus for fabricating a semiconductor device, the apparatus comprising: first and second hermetic reaction chambers having their respective ambients that can be independently controlled, said first and second reaction chambers being connected together hermetically; said first reaction chamber having an interior in which a film consisting only or chiefly of aluminum is formed on a substrate; and said second reaction chamber having an interior in which fluidity is imparted to at least a part of said film consisting only or chiefly of aluminum.

Another aspect resides in an apparatus for fabricating a semiconductor device, the apparatus comprising: first and second hermetic reaction chambers having their respective ambients that can be independently controlled, said first and second reaction chambers being connected together hermetically; said first reaction chamber having an interior in which a film consisting only or chiefly of aluminum is formed on a substrate, said aluminum containing an element for imparting fluidity to said aluminum; and said second reaction chamber having an interior in which fluidity is imparted to at least a part of said film consisting only or chiefly of aluminum.

A further aspect resides in an apparatus for fabricating a semiconductor device, the apparatus comprising: first, second, and third hermetic reaction chambers having their respective ambients that can be independently controlled, said first through third reaction chambers being connected together hermetically; said first reaction chamber having an interior in which a film consisting only or chiefly of aluminum is formed on a substrate; said second reaction chamber having an interior in which a film containing an element for imparting fluidity to said film consisting only or chiefly of aluminum is formed; and said third reaction chamber having an interior in which fluidity is imparted to at least a part of said film consisting only or chiefly of aluminum.

A still other aspect resides in an apparatus for fabricating a semiconductor device, the apparatus comprising: first, second, and third hermetic reaction chambers having their respective ambients that can be independently controlled, said first through third reaction chambers being connected together hermetically; said first reaction chamber having an interior in which a first film containing an element for imparting fluidity to a second film consisting only or chiefly of aluminum is formed on a substrate; said second reaction chamber having an interior in which the second film consisting only or chiefly of aluminum is formed on the first film; and said third reaction chamber having an interior in which fluidity is imparted to at least a part of said second film consisting only or chiefly of aluminum.

A yet other aspect resides in a method for fabricating a semiconductor device using first and second hermetic reaction chambers having their respective ambients that can be independently controlled, said first and second reaction chambers being connected together hermetically; said method comprising: forming a film consisting only or chiefly of aluminum on a substrate in said first reaction chamber; and imparting fluidity to at least a part of said film consisting only or chiefly of aluminum by supplying energy to the film in said second reaction chamber.

A yet still aspect resides in a method for fabricating a semiconductor device using, first and second hermetic reaction chambers having their respective ambients that can be independently controlled, said first and second reaction chambers being connected together hermetically, said method comprising: forming a film consisting only or chiefly of aluminum and containing an element for imparting fluidity to the film consisting only or chiefly of aluminum on a substrate in said first reaction chamber; and imparting fluidity to at least a part of said film consisting only or chiefly of aluminum by supplying energy to the film in said second reaction chamber.

An additional aspect resides in a method for fabricating a semiconductor device using first, second, and third hermetic reaction chambers having their respective ambients that can be independently controlled, said first through third reaction chambers being connected together hermetically, said method comprising: forming a first film containing an element for imparting fluidity to a second film consisting only or chiefly of aluminum on a substrate in said first reaction chamber; forming the second film consisting only or chiefly of aluminum on the first film in said second reaction chamber; and imparting fluidity to at least a part of said second film consisting only or chiefly of aluminum by supplying energy to the second film in said third reaction chamber.

A still additional aspect resides in a method for fabricating a semiconductor device using first, second, and third hermetic reaction chambers having their respective ambients that can be independently controlled, said first through third reaction chambers being connected together hermetically, said method comprising: forming a first film consisting only or chiefly of aluminum on a substrate in said first reaction chamber; forming a second film containing an element for imparting fluidity to said first film consisting only or chiefly of aluminum on said first film in said second reaction chamber; and imparting fluidity to at least a part of said first film consisting only or chiefly of aluminum by supplying energy to said first film in said third reaction chamber.

The present invention also provides a method of fabricating a semiconductor device, said method comprising the steps of: forming an interlayer dielectric film; forming a contact hole; forming a film from a material consisting only or chiefly of aluminum such that said film is electrically connected with at least a part of said semiconductor device; and performing a reflow step to impart substantial fluidity to said film consisting only or chiefly of aluminum by a heat treatment. The step of forming said film and the reflow step are carried out without being exposed to atmosphere.

The apparatus and method described above are further characterized in that the first, second, and third reaction chambers have airtightness and are connected together via a substrate conveyance chamber whose ambient can be controlled independently.

In this configuration, when the substrate is transported from the first to the second reaction chamber and from the second to third reaction chamber, the substrate is passed through the substrate conveyance chamber.

In one feature of the invention, the various films used in the apparatus and method described above are formed by sputtering.

Besides sputtering, other methods such as evaporation, plasma CVD, and low-pressure CVD can be used.

In the configuration described above, the element for imparting fluidity to the film consisting only or chiefly of aluminum is preferably one or more elements belonging to Groups 12–15 of the periodic table.

Especially, where one or more elements selected from the group consisting of germanium (Ge), tin (Sn), gallium (Ga), zinc (Zn), lead (Pb), indium (In), and antimony (Sb) is used, great advantages are produced.

These elements can impart fluidity to the aluminum-based film at temperatures lower than 450° C.

In the various configurations described above, in order to impart fluidity to the aluminum-based film, energy is supplied to it. This is accomplished by a heater or a means for emitting intense light such as UV radiation or IR radiation.

The reflow step is intended to give fluidity to the metallization film forming interconnect electrodes. Where the reflow step is conducted at a temperature below 450° C., the aluminum-based film forming the interconnect electrodes is easily reflowed. As a result, the recessed portion and blowholes in the contact hole can be covered without producing breaks in metal lines.

DETAILED DESCRIPTION OF THE PREFERRED EMBODIMENTS

EMBODIMENT 1

Figure 1:
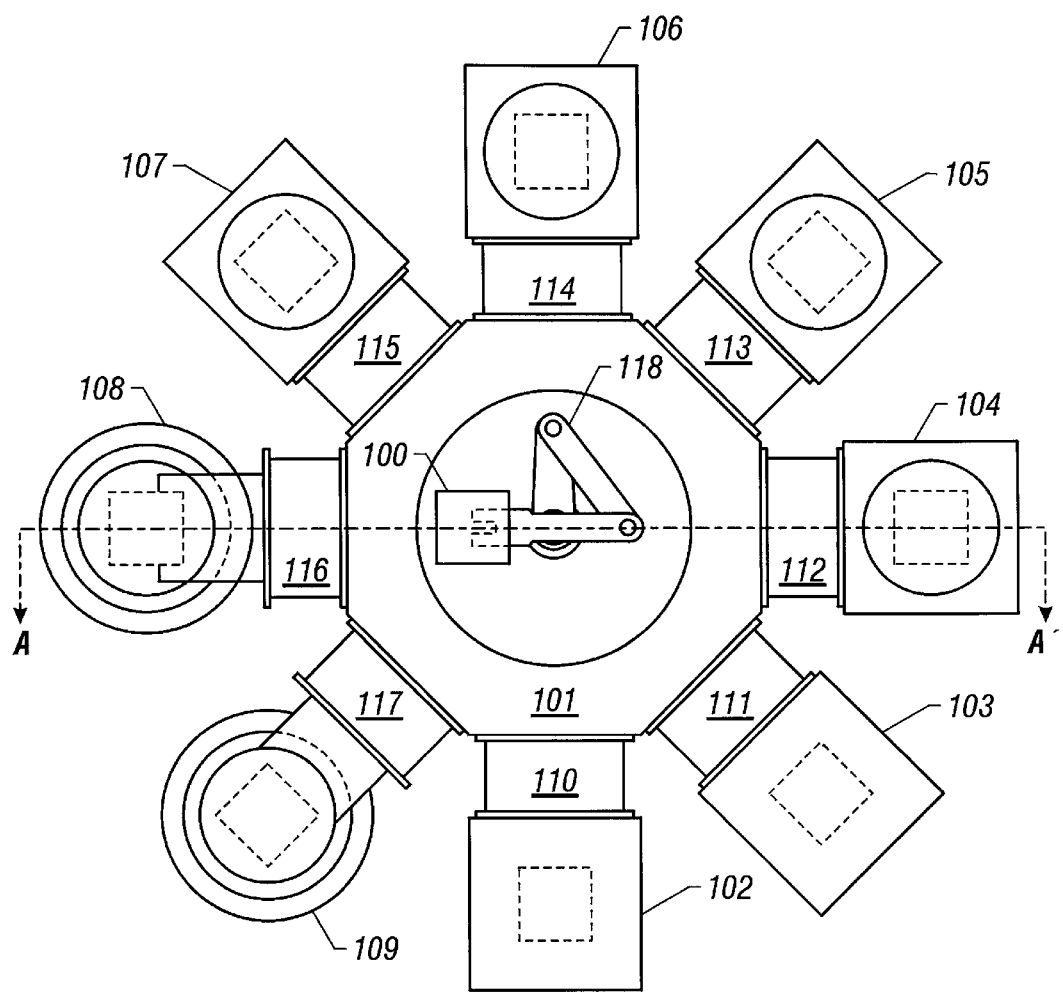
FIG. 1 is a view showing a multichamber sputtering apparatus for use in an embodiment of the invention.
Figure 2:
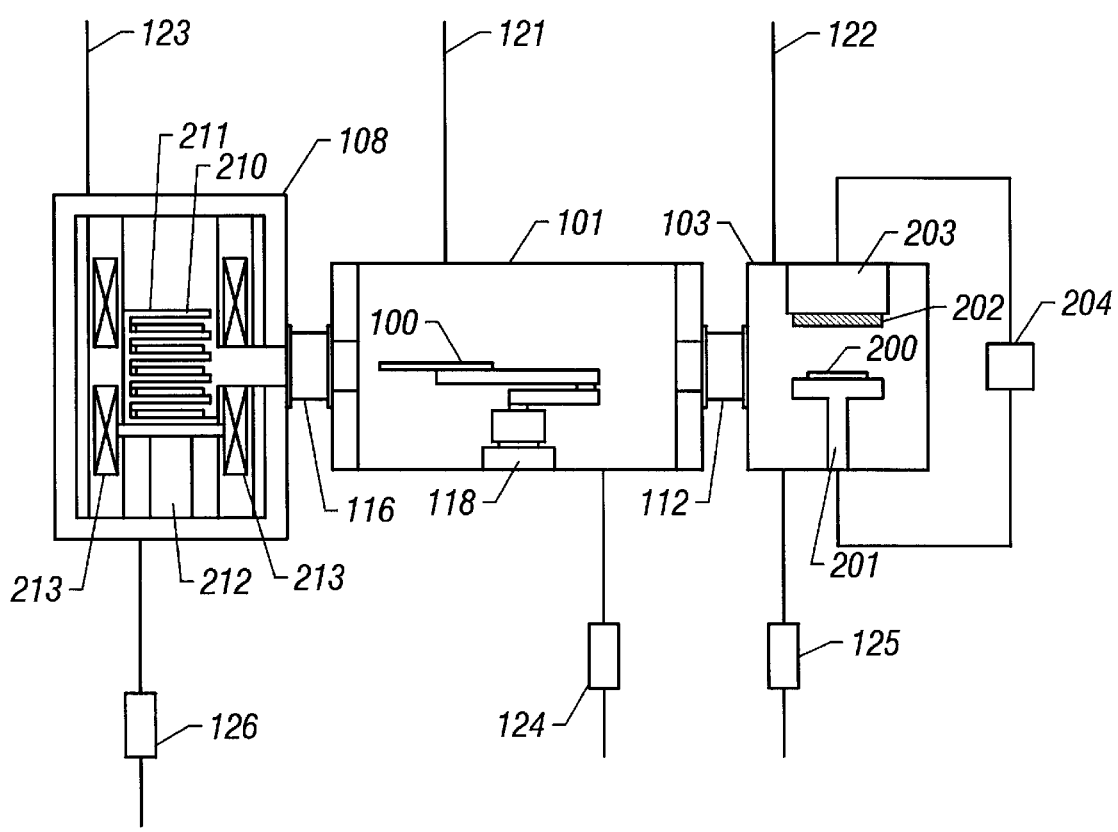
FIG. 2 is a cross-sectional view taken on line A—A' of FIG. 1.

In the present embodiment, there is shown a multichamber sputtering apparatus for executing film formation and reflow steps in succession. FIG. 1 is a schematic of the multichamber sputtering apparatus of the present embodiment. FIG. 2 is a schematic in cross section taken on line A–A' of FIG. 1.

The multichamber sputtering apparatus comprises a conveyance chamber 101, a loading chamber 102, an unloading chamber 103, sputtering chambers 104–107, a heating chamber 108, and a slow cooling chamber 109. These chambers 103–109 are connected to the periphery of the conveyance chamber 101 via gate valves 110–117, respectively.

The conveyance chamber 101 is equipped with a substrate conveyance means 118 for transporting each substrate 100. This substrate 100 is conveyed into the chambers 103–109 through the conveyance chamber 101.

The loading chamber 102 is designed to load a processed substrate into the sputtering apparatus from outside. The substrate is carried into the loading chamber 102 while received in a cassette.

The loading chamber 102 is designed to remove impurity gases such as $H_2O$ and $N_2$ adsorbed on the surface of the processed substrate. Therefore, the loading chamber 103 is equipped with a plasma cleaning means using Ar gas, Xe gas, or the like. This chamber is also equipped with a means for transporting the substrate from the cassette to this plasma cleaning means.

The unloading chamber 103 is designed to carry the processed substrate out of the sputtering apparatus. The unloading chamber 103 is equipped with a nitrogen purging means so that the substrate undergone film formation and reflow steps can be purged with nitrogen.

After the substrates are purged with nitrogen, they are successively received into a cassette installed in the unloading chamber 103. The substrates are carried with the cassette out of the apparatus.

As shown in FIG. 2, the conveyance chamber 101, sputtering chamber 104, and heating chamber 108 are equipped with gas inlet tubes 121–123, respectively, and also with vacuum pumps 124–126, respectively. The ambient and pressure in each chamber can be controlled independent of other chambers by closing off these gate valves 110–117.

Similarly, gas inlet tubes and vacuum pumps are installed in the other chambers 102, 103, sputtering chambers 104–107, and slow cooling chamber 109. The ambient and pressure in each chamber can be controlled independent of other chambers.

As shown in FIG. 2, a stage 201 on which a substrate 200 is to be installed is mounted inside the sputtering chamber 104. The stage 201 incorporates a heater so that the temperature of the substrate 200 can be controlled to a desired value.

A target 202 is held to a holder 203 in an opposite relation to the stage 201. A dc or ac electric field is applied between the stage 201 and holder 203 by a power supply 204 to perform sputtering.

The sputtering chamber 104 can be evacuated to a degree of vacuum $10^{-9}$ Torr by a vacuum pump 125. The sputtering chamber 104 is pumped down to an ultrahigh vacuum in this way to prevent impurities such as nitrogen, oxygen, and carbon from entering a metal film that will be formed.

The ultrahigh vacuum of the order of $10^{-9}$ Torr is accomplished by using a turbomolecular pump, composite molecular pump, or cryopump as the vacuum pump 125. These pumps may be used alone or in combination.

The other sputtering chambers 105–107 shown in FIG. 1 are similar in structure to the sputtering chamber 104. A desired film can be formed on the surface of the substrate 200 by appropriately selecting the target 202.

The chamber 108 is designed to carry out a reflow step, and is capable of heating plural substrates simultaneously.

As shown in FIG. 2, a substrate holder 211 on which plural substrates 210 can be placed is mounted in the heating chamber 108. The substrate holder 211 can be moved up and down by an elevator 212.

The substrates 210 are carried from the conveyance chamber 101 to the heating chamber 108 and placed on the substrate holder 211 by the conveyance means 118. The substrates are moved above or below the substrate holder 211 by the elevator 212 in step with the conveyance of the substrates. Then, the substrates 219 are successively placed within the substrate holder 211.

A heater 213 is mounted around the substrate holder 211 to heat the substrates 210 to a desired temperature.

The slow cooling chamber 109 shown in FIG. 1 is similar in structure to the heating chamber 108. This slow cooling chamber is designed to gradually lower the substrate temperature while controlling the temperature by the heater.

The sputtering apparatus of this construction can perform various processing steps successively in the same ambient. These processing steps include a step for forming a buffer film made from Ti, for example, a step for forming a metallization film (such as an aluminum-based metallization film for forming interconnect electrodes), a step for forming a film consisting mainly of an element for giving fluidity to the material of the metallization film, a reflow step making use of heating, a subsequent cooling or slow cooling step, and a step for forming a film (as made from Ti) that improves the ohmic contact. These processing steps may be carried out in any desired order.

In other words, these processing steps can be executed without being exposed to the atmosphere. As a result, the reflow step can be performed well because the top surface of the lamination film is neither oxidized nor contaminated prior to the reflow step.

More specifically, where heating is done for the reflow step, the fluidity may sometimes increase from the top surface of the lamination film. In this case, if the top surface of the lamination film is exposed to other ambient, especially an oxidizing ambient, or contaminated with impurities, then a good reflow step cannot be carried out.

It is especially important that the lamination film be not exposed to the atmosphere prior to the reflow step provided that the top surface of the lamination surface consists chiefly of aluminum that is easily oxidized.

Of course, the freedom of the various films forming the lamination film from oxidation and contamination is very useful in performing a good reflow step and connecting conductive interconnects.

Especially, the interface between the film consisting chiefly of aluminum and the film consisting mainly of the element for giving fluidity to the aluminum-based film during heating below 450° C. must be prevented from being exposed to the atmosphere, irrespective of which one of these two films is the top surface; otherwise diffusion of the fluidity-giving element into the aluminum-based film is hindered, thus making it impossible to perform the reflow step.

Instead of using the heater 213, the heating chamber 108 may be equipped with a lamp or the like emitting infrared light, ultraviolet light, or other intense light to carry out the reflow step by RTA (rapid thermal annealing).

EMBODIMENT 2

In the present embodiment, a reflow step is carried out in forming conductive electrodes for thin-film transistors (TFTs), using the multichamber sputtering apparatus described in Embodiment 1. A process sequence for the TFTs of the present embodiment is shown in FIGS. 3(A) to 3(D) and 4(A) to 4(C).

Figure 3A:
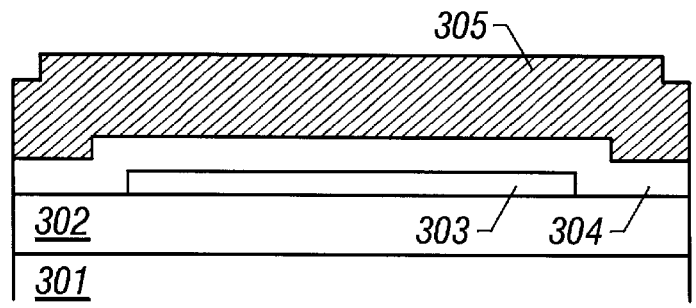
FIGS. 3(A) to 3(D) and 4(A) to 4(C) are views illustrating a process sequence for fabricating a TFT of Embodiment 2.

First, as shown in FIG. 3(A), a glass substrate 301 having an insulating surface is prepared. Silicon oxynitride ($SiO_xN_y$) 302 acting as a buffer film is deposited to a thickness of 2000 Å. This may also be a silicon oxide film or silicon nitride film.

An amorphous silicon film (not shown) having a thickness of 500 Å is formed on the buffer film by plasma CVD or LPCVD and crystallized by an appropriate crystallization method. This crystallization may be carried out by heating or laser irradiation. During the crystallization, an element for promoting the crystallization may be added.

Then, the crystalline silicon film obtained by crystallizing the amorphous silicon film is patterned to form islands of semiconductor layer 303 forming an active layer.

A silicon oxide film 304 that will act as a gate insulator film later is formed to a thickness of 1500 Å by plasma CVD or LPCVD.

Then, a thin metallization film 305 consisting only or mainly of aluminum is formed to a thickness of 4000 Å. This aluminum film 305 will act as a gate electrode later.

Thereafter, anodization is carried out within an electrolyte, using the aluminum film 305 as an anode. The electrolyte is obtained by neutralizing 3% ethylene glycol solution of tartaric acid with aqueous ammonia and adjusting it to a pH of 6.92. Using a platinum cathode, the liquid is processed with an electric current of 5 mA. The voltage is increased up to 10 V.

A dense anodic oxide film (not shown) is formed on the aluminum film 305. This anodic oxide film acts to improve the adhesion to photoresist. The thickness of the anodic oxide film can be controlled by controlling the voltage application time (FIG. 3(A)).

After obtaining the state of FIG. 3(A) in this way, the aluminum film 305 is patterned, thus forming aluminum electrodes which will form gate electrodes and an anodic oxide film later.

Then, a second anodic oxidation process is carried out to form a porous anodic oxide film 306. As an electrolyte, 3% aqueous solution of oxalic acid is used. A platinum cathode is employed. The liquid is processed with an electric current of 2 to 3 mA. The voltage is increased up to 8 V.

At this time, the anodic oxidation progresses parallel to the substrate, so that the porous anodic oxide film 306 is formed on the side surfaces of the aluminum electrodes. The length of the porous anodic oxide film 306 can be controlled by controlling the voltage application time. In the present embodiment, the length is adjusted to 0.7 $\mu$m.

Figure 3B:
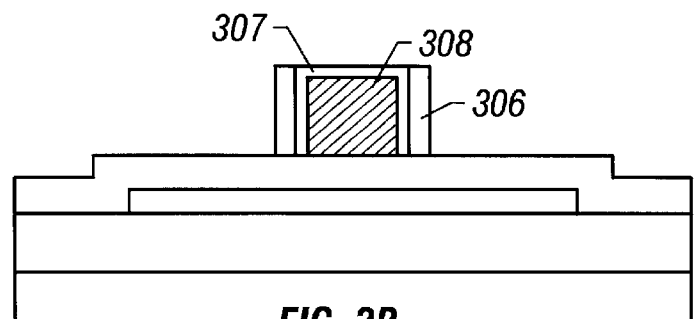

After peeling off the photoresist with proprietary stripping solution, a third anodic oxidation process is effected, thus obtaining a state shown in FIG. 3(B). Aluminum electrodes left after the third anodization step without being anodized become gate electrodes 308.

During the third anodization step, the electrolyte is obtained by neutralizing 3% ethylene glycol solution of tartaric acid with aqueous ammonia and adjusting it to a pH of 6.92. Using a platinum cathode, the liquid is processed with an electric current of 5 to 6 mA. The voltage is increased up to 100 V.

The resulting anodic oxide film 307 is very dense and firm. Therefore, this anodic oxide film protects the gate electrodes 308 from damage in later steps such as implantation step and from heat during heat treatment.

Then, a dopant is implanted into the islands of semiconductor layer 303 by the ion implantation process. For example, when an N-channel TFT is manufactured, phosphorus (P) may be used as the dopant.

First, under the condition of FIG. 3(B), a first ion implantation process is carried out. Phosphorus (P) is implanted at an accelerating voltage of 60 to 90 kV at a dose of 0.2 to $5\times10^{15}$ atoms/cm$^2$.

In the present example, the accelerating voltage is 80 kV, and the dose is $1\times10^{15}$ atoms/cm$^2$.

The gate electrodes 308 and the porous anodic oxide film 306 become a mask. Regions 309 and 310 that will become source/drain regions are formed by self-aligned technology.

Figure 3C:
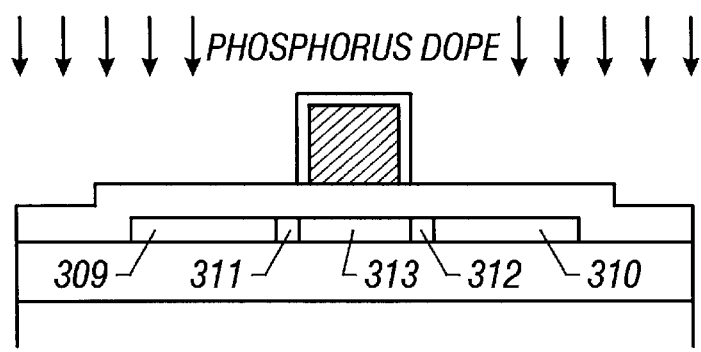

Then, as shown in FIG. 3(C), the porous anodic oxide film 306 is removed, and a second implantation process is performed. The second incorporation of phosphorus (P) is carried out at an accelerating voltage of 60 to 90 kV at a dose of 0.1 to $5\times10^{14}$ atoms/cm$^2$.

In the present example, the accelerating voltage is 80 kV, and the dose is $1\times10^{14}$ atoms/cm$^2$.

The gate electrodes 308 and surrounding anodic oxide film 307 serve as a mask. Regions 311 and 312 more lightly doped than the source region 309 and drain region 310 are formed by self-aligned technology.

At the same time, regions 313 acting as channels for the TFTs are formed by self-aligned technology, because no dopant is implanted at all immediately under the gate electrodes 308. Also, offset regions to which no gate voltage is applied are formed, corresponding to the thickness of the anodic oxide film 307.

Generally, the lightly doped drain (LDD) regions 312 on the sides of the drain regions 310 are known as LDD regions and act to suppress generation of a high electric field between the channel formation region 313 and the drain region 310.

Then, the laminate is irradiated with KrF excimer laser light and thermally annealed. The energy density of the laser light is 250 to 300 mJ/cm$^2$. The thermal annealing is carried out at 300 to 450° C. for hours. In the present embodiment, the energy density of the laser light is 300 mJ/cm$^2$. The thermal annealing is carried out at 400° C. for 1 hour.

This processing step can heal the damage to the crystallinity of the islands of semiconductor layer 303 sustained by the ion implantation process. The crystallinity can be further improved by adding a hydrogen passivation step, which is carried out at 350° C. for 1 hour.

Figure 3D:
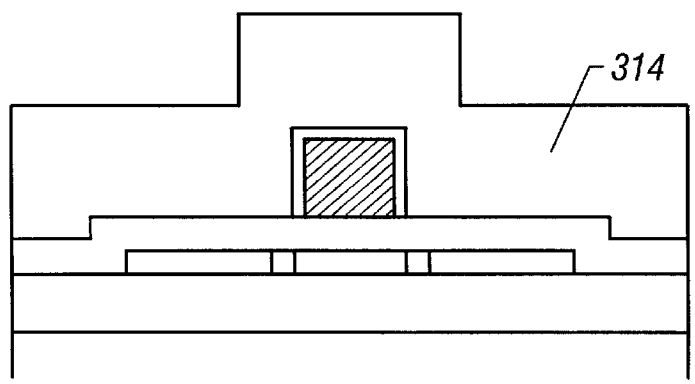

Then, as shown in FIG. 3(D), a first interlayer dielectric film 314 is formed from silicon oxynitride by plasma CVD. This interlayer dielectric film 314 may also be made from a film of silicon oxide or silicon nitride. Furthermore, the interlayer dielectric film may have a multilayer structure.

Figure 4A:
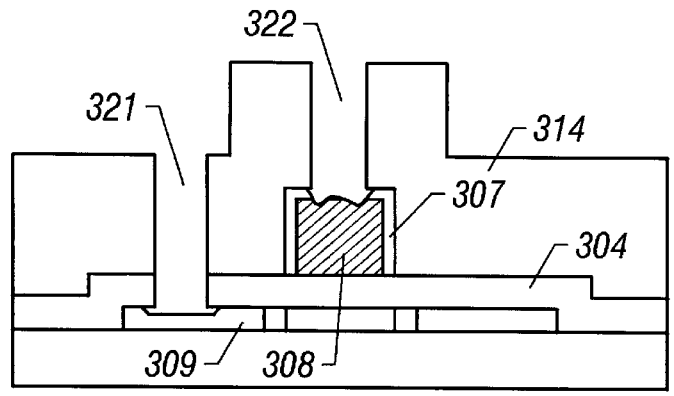
Figure 4B:
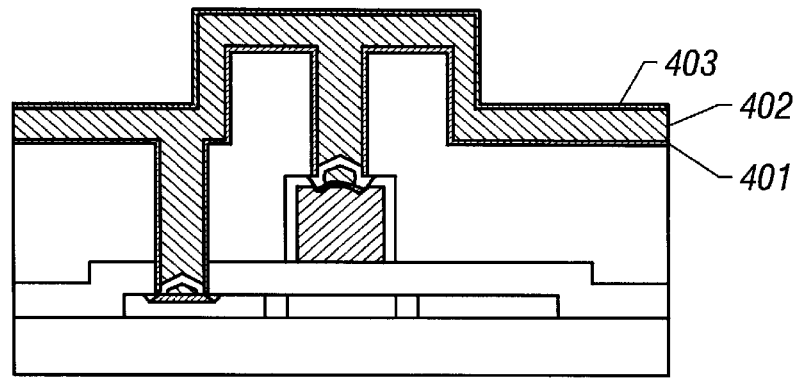

Then, as shown in FIG. 4(A), contact holes 321 and 322 are formed to permit electrical connections of source electrodes, gate interconnects, and TFTS. In the present embodiment, these contact holes 321 and 322 are created by wet etching, using buffered HF.

At this time, the source contact portion 321 and gate contact portion 322 are formed at the same time. This reduces the number of patterning steps, which is desirable for simplification of processing steps.

First, in the source contact portion 321, the first interlayer dielectric film 314 and the gate insulator film 304 are etched in this order to expose each source region 309 of the islands of semiconductor layer 303.

In the gate contact portion 322, the etch rate of the anodic oxide film 307 is small and so the etching is still in progress.

If the anodic oxide film 307 is etched with an HF-based etchant, the etching progresses nonuniformly. Therefore, the gate electrodes 308 are simultaneously etched from locations into which the etchant has permeated.

Accordingly, when the etching of the anodic oxide film 307 is complete, the source region is overetched. In the gate portions, the gate electrodes 308 are etched, so that the contact holes 321 and 322 having recessed portions as shown in FIG. 4(A) are formed.

A processing step for forming conductive interconnects in the contact holes 321 and 322 having such recessed portions is described below.

After forming the contact holes 321 and 322, a film formation step and a reflow step are carried out in succession, using the multichamber sputtering apparatus shown in FIGS. 1 and 2.

In the apparatus shown in FIG. 1, targets placed in the sputtering chambers 104–107 have the following compositions. The target in the sputtering chamber 104 is made of titanium (Ti). The target in the sputtering chamber 105 is made of aluminum (Al) containing 2% copper. The target in the sputtering chamber 106 is made of tin (Sn). The target in the sputtering chamber 107 is made of titanium (Ti).

The plural substrates undergone the steps ending with the state shown in FIG. 4(A) are received in a cassette. This cassette is conveyed into the loading chamber 102 of the apparatus shown in FIG. 1.

In the loading chamber 102, the substrates are successively taken out of the cassette and plasma-cleaned with Ar gas to remove impurity gases such as $H_2O$ and $N_2$ adsorbed on the surfaces of the processed substrates.

After the end of the plasma cleaning, the substrates 100 are transported from the loading chamber 102 to the sputtering chamber 104 via the conveyance chamber 101 by the substrate conveyance means 118, and are placed on the stage 201 inside the sputtering chamber 104. A Ti film 401 acting as a buffer film is formed in the sputtering chamber 104.

In the sputtering chamber 104, after the substrates are placed on the stage 201, the gate valve 112 is closed. The inside is evacuated to the order of $10^{-9}$ Torr by the vacuum pump 125. This lowers the partial pressure of impurity gases and so the impurity concentrations in the metal films formed can be reduced.

When the degree of vacuum has reached on the order of $10^{-9}$ Torr, an ambient gas is introduced through a gas inlet tube 122. DC power is supplied to the stage 201 and to the holder 203 from a power supply 205 to form a film by sputtering. The target 201 is made of titanium (Ti).

The film is formed under the following conditions:

target: titanium (Ti)

ambient: argon (Ar)

pressure: 0.4 Pa electric power: DC 3000 W temperature: room temperature

As a result, the Ti film 401 is formed as a buffer film to a thickness of about 500 Å. Since titanium exhibits excellent step coverage, it can cover recessed portions and blowholes to some extent.

This Ti film 401 prevents the aluminum metallization becoming conductive interconnects from reacting with silicon that is a component of the semiconductor layer in the source region 309; otherwise a silicide would be formed.

At first, accordingly, a good ohmic contact is made with the Ti film 401. Then, a film consisting chiefly of aluminum and becoming interconnect electrodes is formed, followed by execution of a reflow step. As a result, more reliable contacts can be realized.

This thin buffer film 401 improves the wettability of a surface of the aluminum film that will be formed later. As a consequence, at the stage of the aluminum formation, if the entrances of the contact holes having very small diameters are clogged up by the aluminum film, the aluminum is reflowed, thus filling the contact holes. Preferably, the material of the buffer film 401 is polysilicon or Ti.

Then, the substrates are transported into the sputtering chamber 105 by the conveyance means 118. In the sputtering chamber 105, sputtering is performed with a target consisting of aluminum (Al) containing 2% copper. Instead of copper, silicon (Si) or scandium (Sc) may be added to the aluminum.

The aluminum-based film 402 is formed to a thickness of 2000 to 6000 Å. In the present embodiment, the thickness is 4000 Å. Under this condition, it is impossible to fully cover the recessed portions and blowholes. Therefore, it is highly likely that metal lines break within the contact holes (FIG. 4(B)).

The film is formed under the following conditions:
target: aluminum (Al) (containing 2% copper) ambient: argon (Ar)
pressure: 0.4 Pa
electric power: DC 4A
temperature: room temperature The sputtering chamber 105 is also evacuated to the order of $10^{-9}$ Torr before the film is formed by sputtering.

Then, in the sputtering chamber 106, a film consisting mainly of an element for giving substantial fluidity to the aluminum film in a later reflow step is formed on the film 402 consisting chiefly of aluminum. This element is one or more elements selected from Groups 12–15 of the periodic table.

Especially, germanium (Ge), tin (Sn), gallium (Ga), zinc (Zn), lead (Pb), indium (In), and antimony (Sb) are preferable. In this embodiment, a tin film is used.

The substrates are carried into the sputtering chamber 106 by the conveyance means 118. Sputtering is carried out in the sputtering chamber 106. The tin film, 403, is formed to a thickness of 200 to 100 Å. In this embodiment, the thickness is 50 Å. The sputtering chamber 106 is also evacuated to the order of $10^{-9}$ Torr before the film is formed by sputtering (FIG. 4(B)).

The film is formed under the following conditions:
target: tin (Sn)
ambient: argon (Ar)
pressure: 0.4 Pa
electric power: DC 0.3A
temperature: room temperature The step for forming the film 402 consisting chiefly of aluminum and the step for forming the tin film 403 are carried out in succession without being exposed to the atmosphere. This is quite important for the present invention. If the aluminum-based film 402 is exposed to the atmosphere after it is formed, and if the tin film 403 is formed on the aluminum-based film, tin does not diffuse well into the aluminum film. Consequently, a reflow process does not take place, for the following reason. If the aluminum film surface is exposed to the atmosphere, a natural oxide film is formed or impurity contamination occurs, thus hindering the diffusion of the tin film 403.

The same situation occurs where a film consisting principally of an element that is other than tin but imparts fluidity to the aluminum is used.

Thereafter, a reflow step is performed. Each substrate on which the tin film 403 is formed is taken out of the sputtering chamber 106 by the conveyance means 118 and moved to the heating chamber 108.

It is necessary that this reflow step be executed within a temperature range of 375 to 450° C., taking account of the heat resistance of the gate electrode 308. In the present embodiment, the gate electrode 308 is protected by the anodic oxide film 307 and thus has higher heat resistance than normal.

In the present embodiment, a heat treatment is carried out within the heating chamber 108 at 450° C. for 1 hour at atmospheric pressure. The treating ambient is preferably a vacuum or inert ambient of nitrogen, argon, or the like. In the present embodiment, the ambient consists of nitrogen ($N_2$).

This heat treatment causes a reaction at the interface between the tin film 403 and the film 402 consisting mainly of aluminum. Tin diffuses into the aluminum film, producing an alloy layer including aluminum, copper, and tin as its constituents.

Tin is incorporated around the top layer of the aluminum-based film. Therefore, the film exhibits fluidity at temperatures below 450° C. Hence, the reflow step progresses.

This reflow step gives fluidity to the vicinities of the top layer of the aluminum film 402, thus covering the recessed portions and blowholes, or crevices, without breaks in conductive lines. Therefore, the breaks in the aluminum-based film 402 are all shorted. This assures electrical connections with the source region 309 and the gate electrode 308.

The step for forming the tin film 403 and the reflow step making use of heating are carried out in succession without being exposed to the atmosphere. This is very important to the present invention.

It has been found that the state of the surface on which the reflow process occurs is extremely important to the good reflow process.

In the present embodiment, if the surface of the top tin film 403 is exposed to the atmosphere, the fluidity of the aluminum-based film 402 drops or becomes nonuniform, so that sufficient reflow process does not take place. As a consequence, defective contacts may be produced.

After the end of the reflow step, the substrates are moved out of the heating chamber 108 by the conveyance means 118 and transported to the slow cooling chamber 109, where they are slowly cooled down to a desired temperature.

Then, the substrates are conveyed into the sputtering chamber 107 by the conveyance means 118. Within the sputtering chamber 107, sputtering is carried out with a target of titanium (Ti). A Ti film 404 is formed to a thickness of about 500 Å under the same conditions as for the buffer film, or the Ti film 401.

This Ti layer 404 is effective in realizing good ohmic contacts where electrical connections with the conductive interconnects formed in the overlying layer are made.

Then, the substrates taken out of the sputtering chamber 107 are conveyed by the conveyance means 118 into the unloading chamber 103, where they are purged with nitrogen. Subsequently, the substrates are received in a cassette. The nitrogen purging acts to clean the substrates and to lower the substrate temperature. The lowered substrate temperature suppresses formation of an oxide film on the surfaces of the substrates when they are exposed to the atmosphere.

After all substrates have undergone the film formation step and reflow step, they are taken out of the unloading chamber 103 while received in the cassette.

In this way, the sputtering apparatus of Embodiment 1 carries out the film formation step and the reflow step for plural substrates in succession. During these steps, the substrates are not exposed to the atmosphere at all. The various films are prevented from being oxidized or contaminated. Hence, the film formation and reflow steps assure good electrical contacts.

Figure 4C:
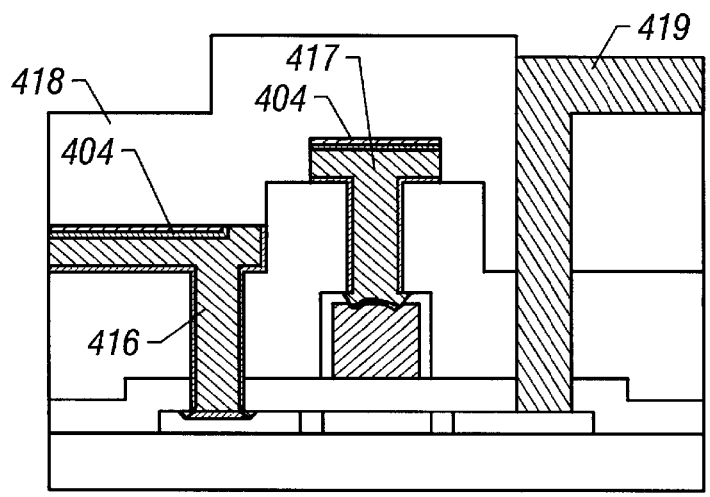

After passing through these processing steps, laminated films 401–404 are patterned to form a source electrode 416 and a gate electrode 417, as shown in FIG. 4(C). Then, a second interlayer dielectric film 418 is formed.

Before the second interlayer dielectric film 418 is formed, the source electrode 416 and the gate electrode 417 are coated with a silicon oxide film or silicon oxynitride film (not shown), which serves as a buffer film permitting formation of a resinous material with good adhesion.

The resinous material is deposited as the second interlayer dielectric film 418 on the buffer film. A resinous material having a relative dielectric constant lower than those of silicon oxide and silicon nitride can be used as that resinous material. Therefore, the effects of capacitance created between a transparent electrode (formed later) and a TFT can be reduced.

Finally, a transparent electrode 419 is formed from ITO, thus fabricating a TFT as shown in FIG. 4(C). The resinous material of the second interlayer dielectric film 418 can provide excellent planarity on the device. This makes it possible to apply a uniform voltage to the transparent electrode.

TFTs fabricated in this way show good contacts irrespective of the shapes of the contact holes. This prevents breaks in conductive interconnects or electrodes; otherwise the TFTs would fail to operate satisfactorily.

EMBODIMENT 3

The present embodiment is similar to Embodiment 2 except for the structure of the laminated film forming electrodes of TFTs. This different film structure is subjected to a reflow step as given below.

Each TFT is fabricated by processing steps similar to those of Embodiment 2 to form a contact hole having a recessed portion, as shown in FIG. 4(A).

Figure 5A:
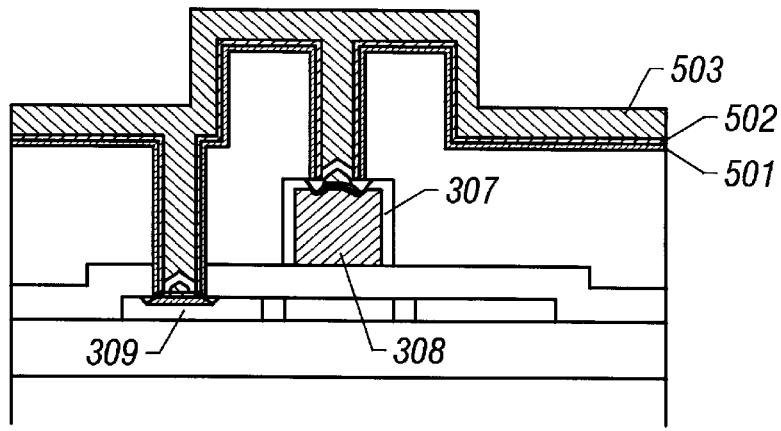
FIGS. 5(A) to 5(C) are a view showing sputtering and reflow steps of Embodiment 3.

A film formation step and a reflow step are performed in succession by the use of the multichamber sputtering apparatus shown in FIG. 1. A process sequence for the present embodiment is shown in FIG. 5.

In Embodiment 3, targets positioned in the sputtering chambers of the apparatus shown in FIG. 1 have the following compositions. The target placed in the sputtering chamber 104 is made of titanium (Ti). The target in the sputtering chamber 105 is made of germanium (Ge). The target in the sputtering chamber 106 is aluminum containing 2% copper. The target in the sputtering chamber 107 is titanium (Ti).

A plurality of substrates undergo processing steps of Embodiment 2 ending with the state shown in FIG. 4(A). The substrates are received in a cassette and conveyed into the loading chamber 102 of the apparatus shown in FIG. 1.

The conveyance means 118 conveys the substrates 100 from the cassette to the sputtering chamber 104 through the conveyance chamber 101.

In the sputtering chamber 104, sputtering is performed with a target of titanium (Ti). A Ti film 501 is formed as a buffer film to a thickness of about 500 Å under the same conditions as those used in Embodiment 2.

Next, a film is formed which consists chiefly of an element for giving substantial fluidity to the aluminum-based film in the subsequent reflow step. Materials given in Embodiment 2 can be used as the material of this fluidity-imparting film. In the present embodiment, the fluidity-imparting film is made of germanium.

Then, the substrates are transported to the sputtering chamber 105 by the conveyance means 118. In the sputtering chamber 105, sputtering is carried out with a target of germanium (Ge) to form a germanium film 502 to a thickness of 20 to 100 Å. In the present embodiment, the germanium film 502 is formed to a thickness of 50 Å under the following conditions.

target: germanium (Ge)
ambient: argon (Ar)
pressure: 0.4 Pa
electric power: DC 1 A
temperature: room temperature Thereafter, the substrates are conveyed into the sputtering chamber 106 by the conveyance means 118. In the sputtering chamber 106, sputtering is carried out with a target of aluminum (Al) containing 2% copper. Instead of copper, silicon (Si) or scandium (Sc) may be added. The film formation conditions are the same as used in Embodiment 2.

The film 503 consisting mainly of aluminum is formed to a thickness of 2000 to 6000 Å (4000 Å in this embodiment). Under this condition, the recessed portions and blowholes cannot be fully covered. Therefore, it is highly likely that metal lines break within the contact holes (FIG. 5(A)).

The film 502 consists principally of the element for giving substantial fluidity to the aluminum. The step for forming this film 502 and the step for forming the aluminum-based film 503 are carried out in succession without being exposed to the atmosphere, in the same way as in Embodiment 2. This is quite important for a good reflow step.

Then, the reflow step is executed. The substrates on which the aluminum-based film 503 is formed are taken out of the sputtering chamber 106 and moved into the heating chamber 108 by the conveyance means 118.

It is necessary that this reflow step be executed within a temperature range of 375 to 450° C., taking account of the heat resistance of the gate electrode 308. In the present embodiment, the gate electrode 308 is protected by the anodic oxide film 307 and thus has higher heat resistance than normal.

In the present embodiment, a heat treatment is carried out within the heating chamber 108 at 400° C. for 1 hour at atmospheric pressure. The treating ambient is preferably a vacuum or inert ambient of nitrogen, argon, or the like. In the present embodiment, the ambient consists of nitrogen.

This heat treatment brings about a reaction at the interface between the germanium film 502 and the film 503 consisting mainly of aluminum. Germanium diffuses into the aluminum-based film 503, producing an alloy layer including aluminum, copper, and germanium as its constituents.

Germanium is incorporated near the bottom layer of the aluminum-based film. For this reason, the layer shows fluidity at temperatures lower than 400° C., so that the reflow step proceeds.

Figure 5B:
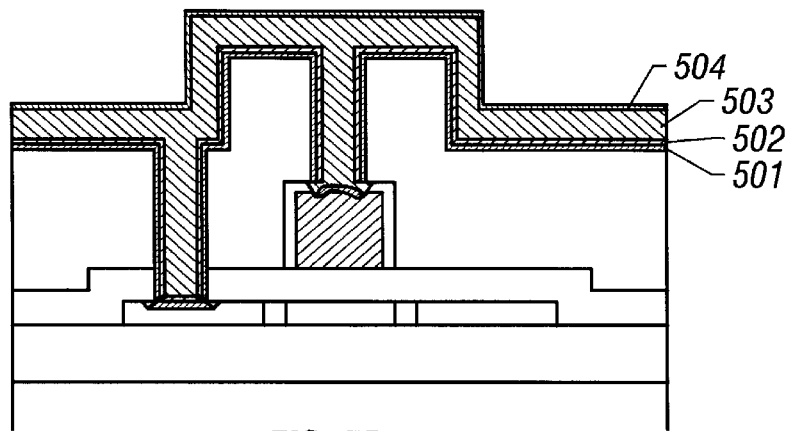

This reflow step imparts fluidity to the vicinities of the bottom layer of the aluminum film 503. The recessed portions and blowholes are covered without permitting breaks in metal lines. Therefore, as shown in FIG. 5(B), breaks in the aluminum-based film 503 are all shorted. As a result, complete electrical connection with the source region 309 or gate electrode 308 is made.

It is extremely important to conduct the step for forming the aluminum film 503 and the reflow step utilizing heating in succession without being exposed to the atmosphere.

In the present embodiment, if the film consisting mainly of aluminum is exposed to the atmosphere, a natural oxide film is formed on the surface. Furthermore, adhesion of impurities deteriorates the fluidity of the film consisting principally of aluminum or makes it nonuniform, so that the reflow process is not carried out sufficiently. As a result, defective contacts may be produced.

After the end of the reflow step, the substrates are taken out of the heating chamber 108 by the conveyance means 118 and moved into the slow cooling chamber 109, where the substrates are slowly cooled down to a desired temperature.

Subsequently, the substrates are carried into the sputtering chamber 107 by the conveyance means 118. In the sputtering chamber 107, sputtering is performed with a target of titanium (Ti). A Ti film 504 is formed to a thickness of approximately 500 Å under the same conditions as for Embodiment 2 (FIG. 5(B)).

Then, the film formation step and the reflow step are completed in the same way as in Embodiment 2. These film formation and reflow steps are carried out for the plural substrates in succession. During these processing steps, the surface of each film is not exposed to the atmosphere at all. Oxidation and contamination of the films are prevented. Hence, the film formation and reflow steps result in good electrical contacts.

Figure 5C:
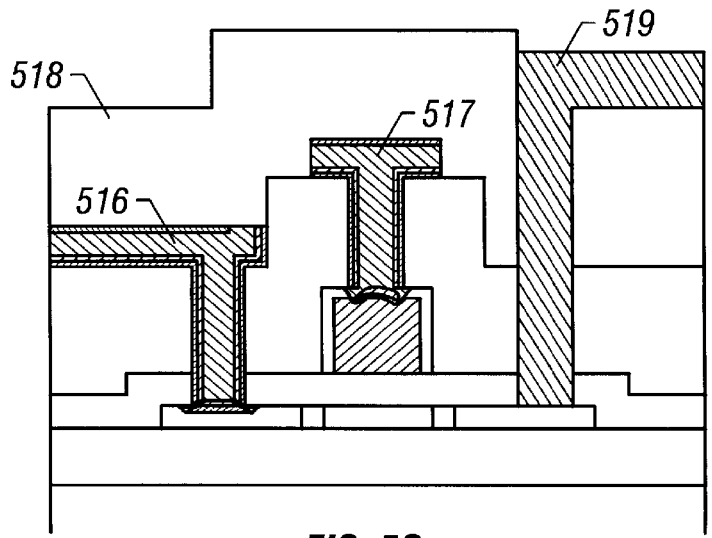

After passing through these processing steps, the laminated films 501–504 are patterned to form source electrode 516 and gate electrode 517 in the same way as in Embodiment 2. A resinous material is deposited as a second interlayer dielectric film 518 on them. In this way, TFTs having good contacts as shown in FIG. 5(C) are completed.

EMBODIMENT 4

The present embodiment is similar to Embodiment 2 except for the structure of the laminated film forming electrodes of TFTs. This different film structure is subjected to a reflow step as given below.

Each TFT is fabricated by processing steps similar to those of Embodiment 2 to form a contact hole having a recessed portion, as shown in FIG. 4(A).

Figure 6A:
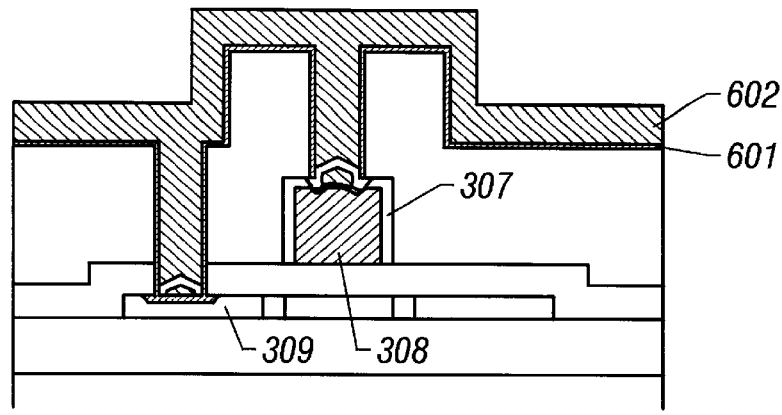
FIGS. 6(A) to 6(C) are a view showing sputtering and reflow steps of Embodiment 4.

A film formation step and a reflow step are performed in succession through the use of the multichamber sputtering apparatus shown in FIG. 1. A process sequence for the present embodiment is shown in FIG. 6.

In Embodiment 4, targets positioned in the sputtering chambers of the apparatus shown in FIG. 1 have the following compositions. The target placed in the sputtering chamber 104 is made of titanium (Ti). The target in the sputtering chamber 105 is made of aluminum (Al) containing 20–40% (e.g., 20%) germanium and 2% copper. The target in the sputtering chamber 106 is made of titanium (Ti). It is to be noted the sputtering chamber 107 is not used in the present embodiment.

A plurality of substrates undergo processing steps of Embodiment 2 ending with the state shown in FIG. 4(A). The substrates are received in a cassette and conveyed into the loading chamber 102 of the apparatus shown in FIG. 1.

The conveyance means 118 conveys the substrates from the cassette to the sputtering chamber 104 through the conveyance chamber 101.

In the sputtering chamber 104, sputtering is performed with a target of titanium (Ti). A Ti film 601 is formed as a buffer film to a thickness of approximately 500 Å under the same conditions as those used in Embodiment 2.

The substrates are transported into the sputtering chamber 105 by the conveyance means 118. In the sputtering chamber 105, a film 602 is formed which consists chiefly of aluminum and contains an element for conferring substantial fluidity on the aluminum-based film in a later reflow step. Germanium (Ge) is contained as this element and accounts for 20 to 40%, e.g., 20%, of aluminum. A target comprising aluminum containing 20% germanium and 2% copper is used. The film is formed under the same conditions as those used in Embodiment 3.

The film 602 consisting mainly of aluminum is formed to a thickness of 2000 to 6000 Å. In this embodiment, the thickness is 4000 Å. Under this condition, the recessed portions and blowholes cannot be fully covered. Therefore, it is highly likely that the metal lines break in the contact holes (FIG. 6(A)).

In this case, the processing temperature of the later reflow step varies depending on the germanium content. In the present embodiment, the film consists principally of aluminum. Therefore, the germanium content is set to 20 to 40 atomic % so that the reflow step can be performed below 450° C., preferably below 400° C.

Figure 7:
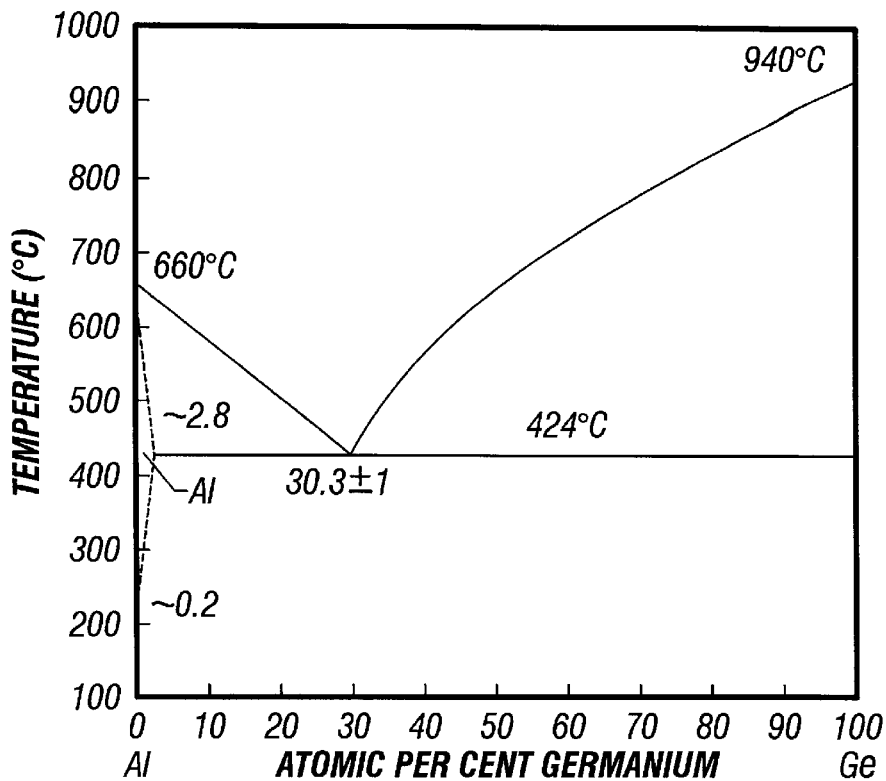
FIG. 7 is a diagram showing phases of a binary system consisting of aluminum and germanium.
Figure 8:
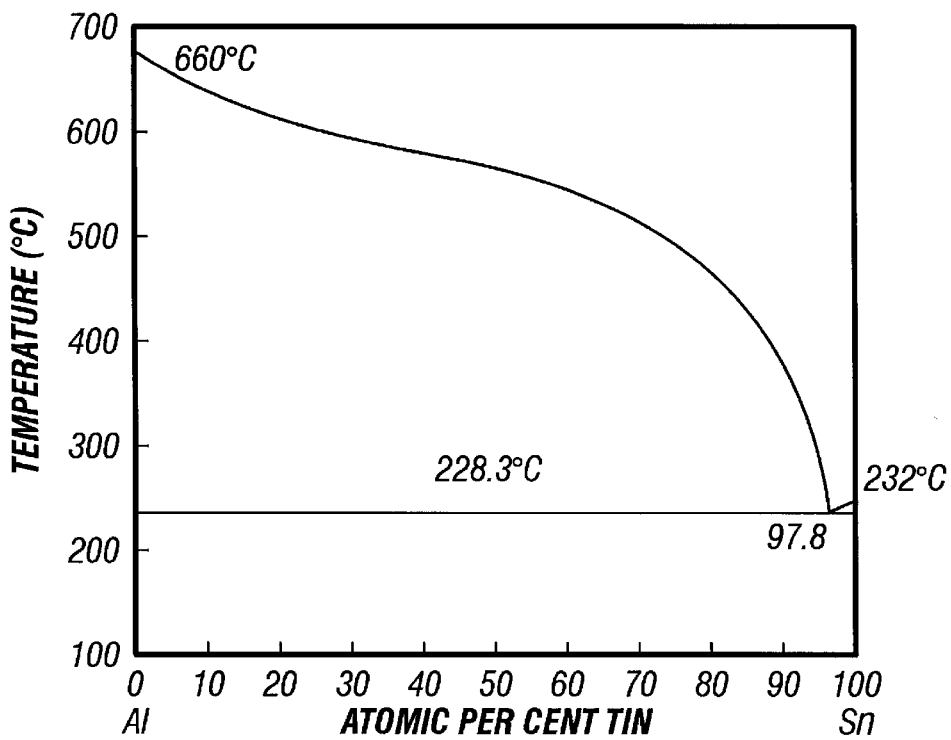
FIG. 8 is a diagram showing phases of a binary system consisting of aluminum and tin.
Figure 9:
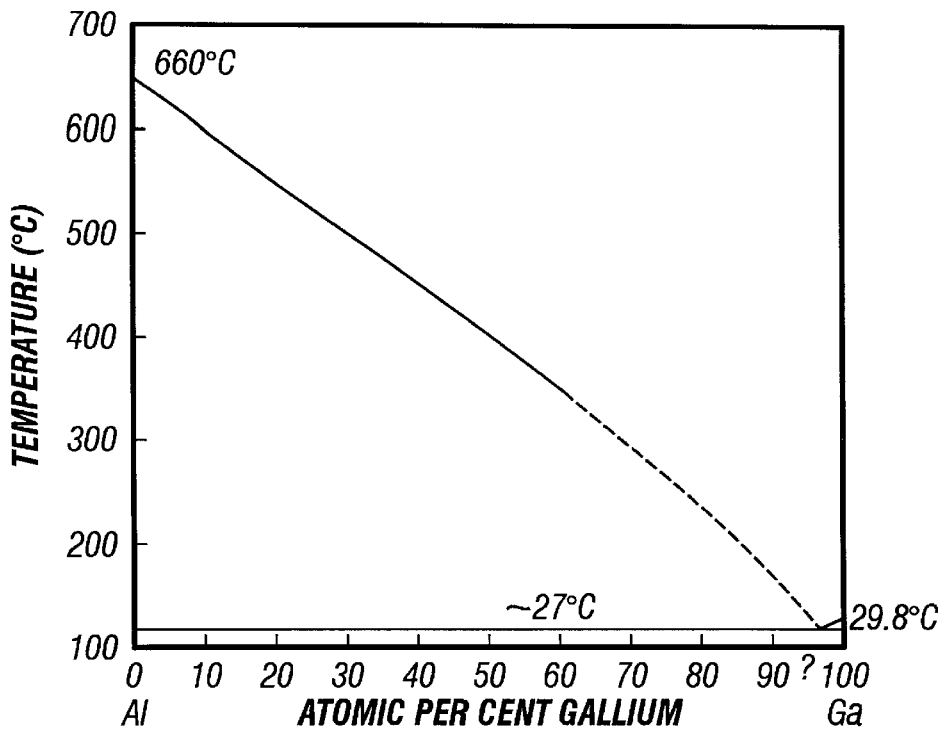
FIG. 9 is a diagram showing phases of a binary system consisting of aluminum and gallium.
Figure 10:
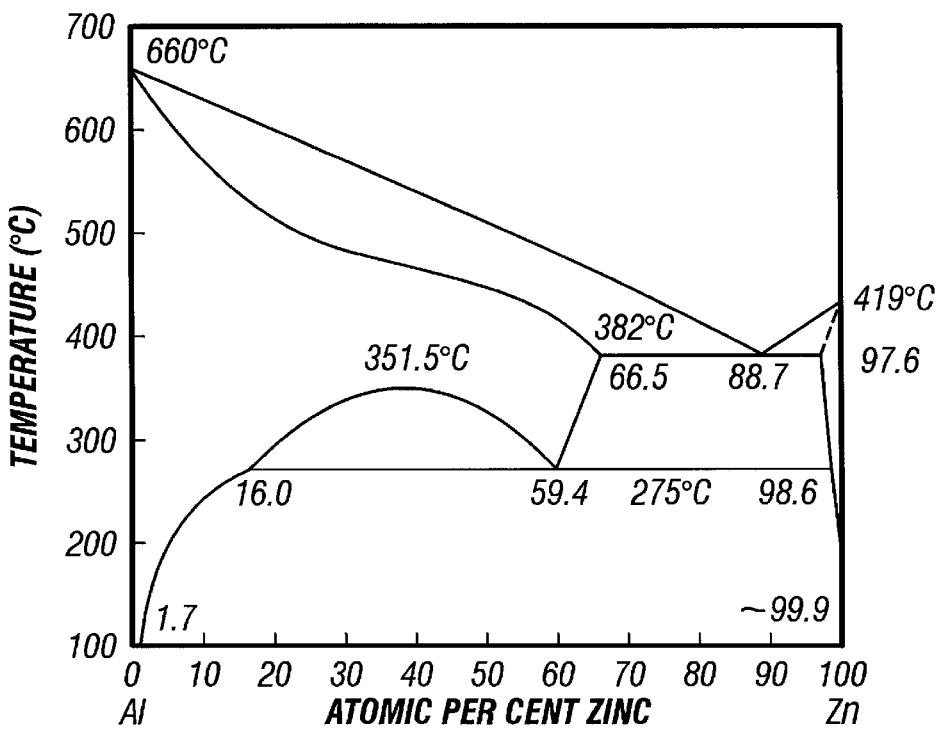
FIG. 10 is a diagram showing phases of a binary system consisting of aluminum and zinc.
Figure 11:
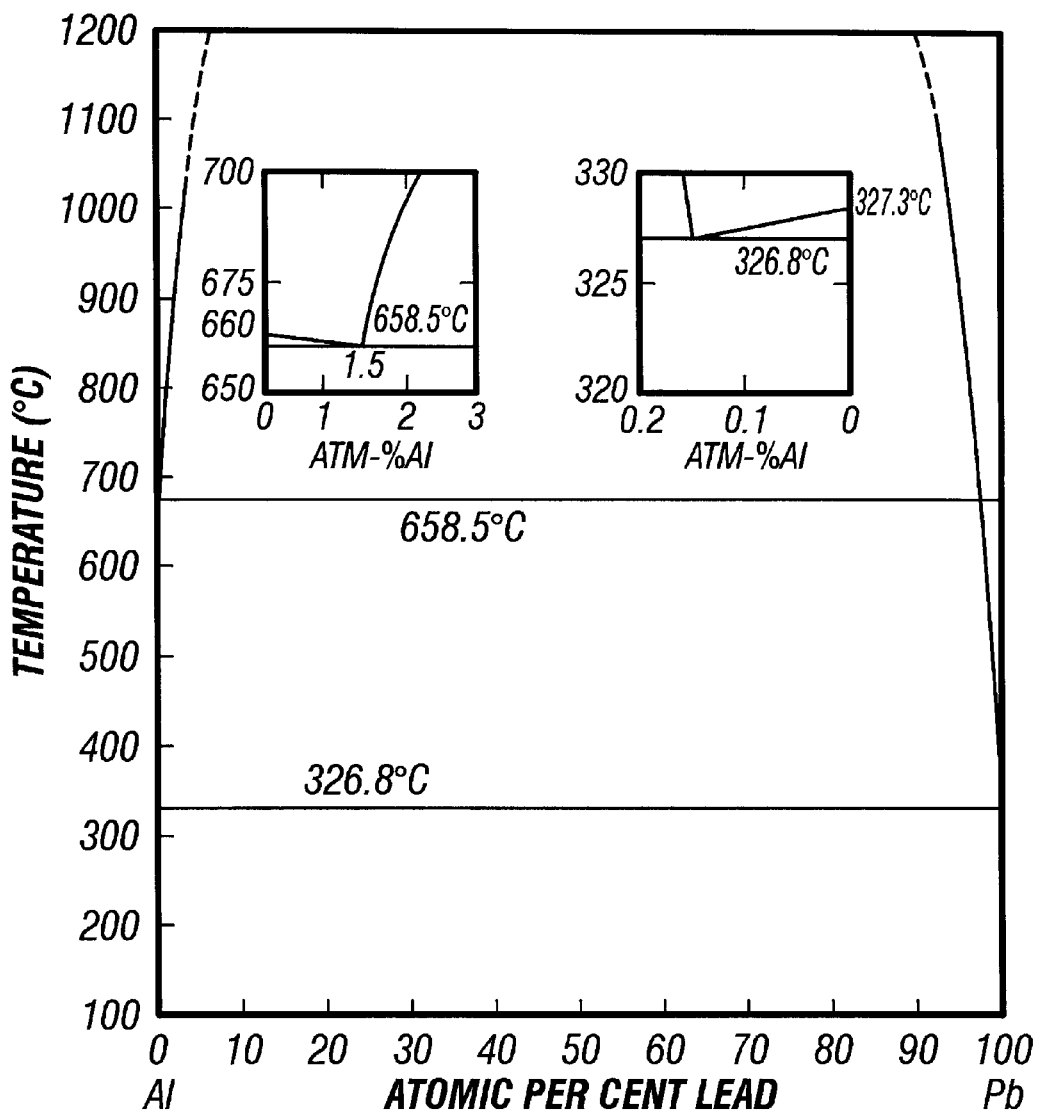
FIG. 11 is a diagram showing phases of a binary system consisting of aluminum and lead.
Figure 12:
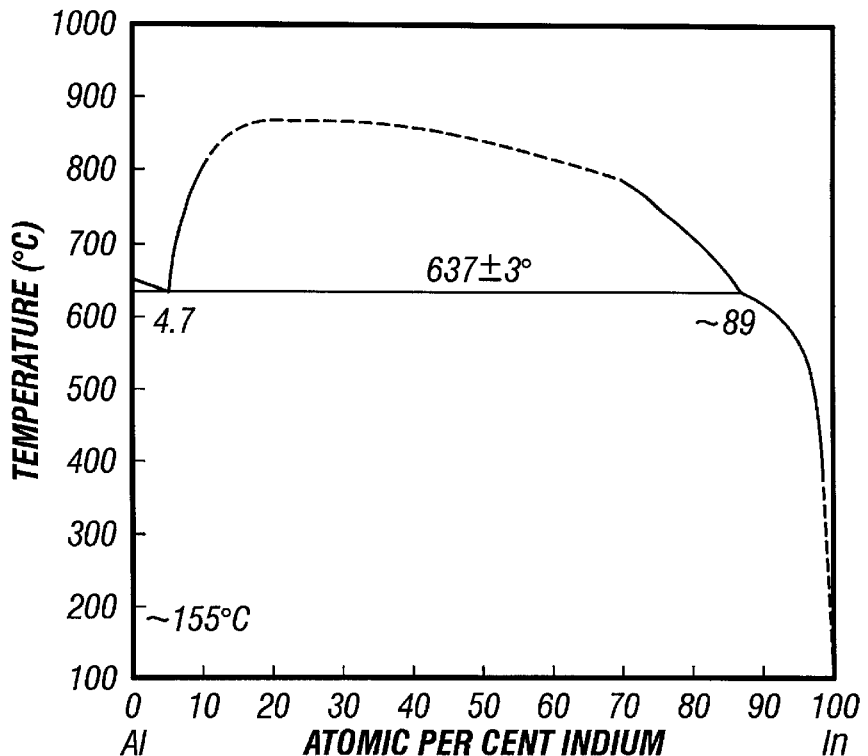
FIG. 12 is a diagram showing phases of a binary system consisting of aluminum and indium.

The concentration of the added germanium is a value found from the germanium content (30 atomic %) at which a eutectic point (424° C.) is present in the aluminum-germanium phase diagram of FIG. 7. In practice, these values of 20 to 40 atomic % would be appropriate because fluidity occurs below the eutectic point.

Germanium (Ge) is an element added to the film 602 consisting principally of aluminum. Besides germanium (Ge), elements that impart substantial fluidity to the aluminum as described in Embodiment 2 can be used.

Copper is added to suppress abnormal growth of aluminum such as hillocks. Instead of copper, silicon (Si) or scandium (Sc) may be added.

Then, a reflow step is performed. The substrates on which the film 602 consisting mainly of aluminum is formed are taken out of the sputtering chamber 105 and moved into the heating chamber 108 by the conveyance means 118.

It is necessary that this reflow step be executed within a temperature range of 375 to 450° C., taking account of the heat resistance of the gate electrode 308. In the present embodiment, the gate electrode 308 is protected by the anodic oxide film 307 and thus has higher heat resistance than normal. In the present embodiment, a heat treatment is carried out within the heating chamber 108 at 400° C. for 1 hour in a vacuum or inert ambient of nitrogen, argon, or the like. In the present embodiment, the ambient consists of nitrogen.

This heat treatment brings about a reaction on the aluminum-based film 602, mostly on its top surface. The aluminum film 602 shows fluidity and thus the reflow process progresses.

Figure 6B:
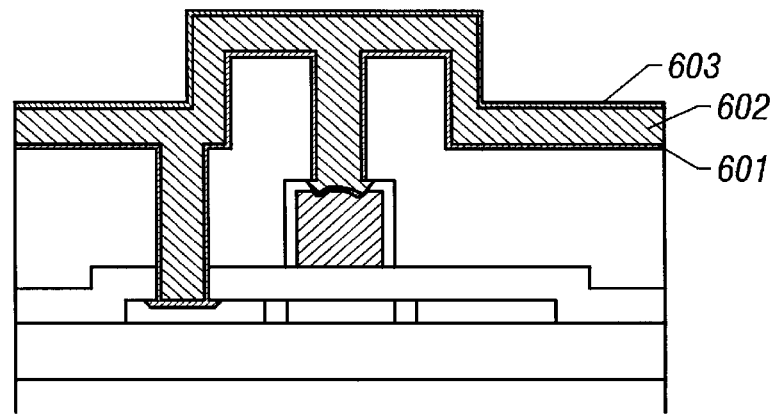

This reflow step imparts fluidity to the vicinities of the top layer of the aluminum-based film 602. The recessed portions and blowholes are covered without permitting breaks in metal lines. Therefore, as shown in FIG. 6(B), breaks in the aluminum-based film 602 are all shorted. As a result, complete electrical connections with the source region 309 and gate electrode 308 are made.

The step for forming the film 602 consisting chiefly of aluminum and the reflow step using heating are carried out in succession without being exposed to the atmosphere. This is of great importance.

In the present embodiment, if the film 602 consisting mainly of aluminum is exposed to the atmosphere, a natural oxide film is formed on the surface. Furthermore, adhesion of impurities deteriorates the fluidity of the film consisting principally of aluminum or renders it nonuniform, so that the reflow process is not carried out sufficiently. As a result, defective contacts may be produced.

After the end of the reflow step, the substrates are taken out of the heating chamber 108 by the conveyance means 118 and sent into the slow cooling chamber 109, where the substrates are slowly cooled down to a desired temperature.

Subsequently, the substrates are carried into the sputtering chamber 106 by the conveyance means 118. In the sputtering chamber 106, sputtering is performed with a target of titanium (Ti). A Ti film 603 is formed to a thickness of approximately 500 Å under the same conditions as for Embodiment 2 (FIG. 6(B)).

Then, the film formation step and the reflow step are completed in the same way as in Embodiment 2. These film formation and reflow steps are carried out for the plural substrates in succession. During these processing steps, the surface of each film is not exposed to the atmosphere at all. Oxidation and contamination of the films are prevented. Hence, the film formation and reflow steps can be carried out in such a way that the aluminum-based film makes good electrical contacts with the upper and lower titanium films.

Figure 6C:
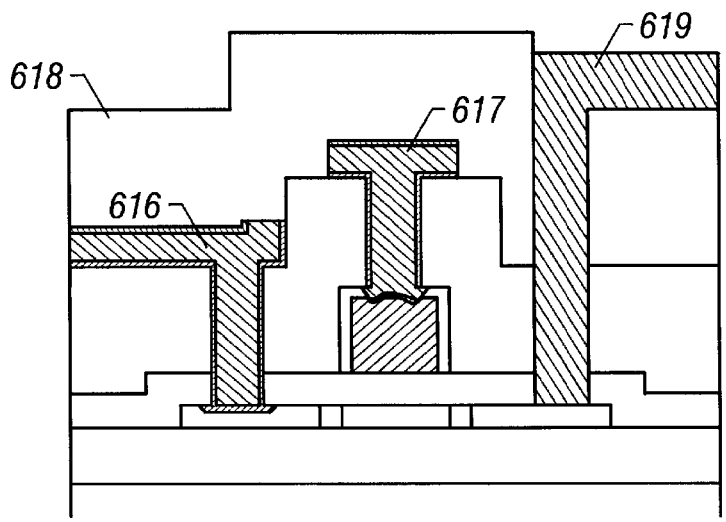

After passing through these processing steps, the laminated films 601–603 are patterned to form source electrode 616 and gate electrode 617 in the same way as in Embodiment 2. A resinous material is deposited as an interlayer dielectric film 618 on them. In this way, TFTs having good contacts as shown in FIG. 6(C) are completed.

EMBODIMENT 5

The present embodiment is similar to Embodiment 4 except that the metallic element added to the metallization material forming interconnect electrodes is other than germanium. Especially, the concentration of the added element is described in detail. Since a process sequence for fabricating TFTs of the present embodiment is similar to that of Embodiment 4, it will not be described.

In the present embodiment, aluminum is included as the main constituent and so it is necessary to adjust the concentration of the added element so that the film can reflow below 450° C. For reference, binary system phase diagrams of aluminum, germanium, tin, gallium, zinc, lead, indium, and antimony are shown in FIGS. 7–13.

It can be seen from these phase diagrams that if the elements are contained in aluminum in the following concentrations, they can exist in liquid phase even at 450° C. without any depositions:

Ge: 25 to 32 atomic % (FIG. 7)
Sn: over 85 atomic % (FIG. 8)
Ga: over 45 atomic % (FIG. 9)
Zn: over 65 atomic % (FIG. 10)
Pb: over 99 atomic % (FIG. 11)
In: over 98 atomic % (FIG. 12)
The concentrations of the added elements have been found from their contents at which eutectic points are present in the phase diagrams. In practice, fluidity takes place at temperatures lower than the eutectic points. Therefore, concentration ranges of ± tens of percent can be given.

Figure 13:
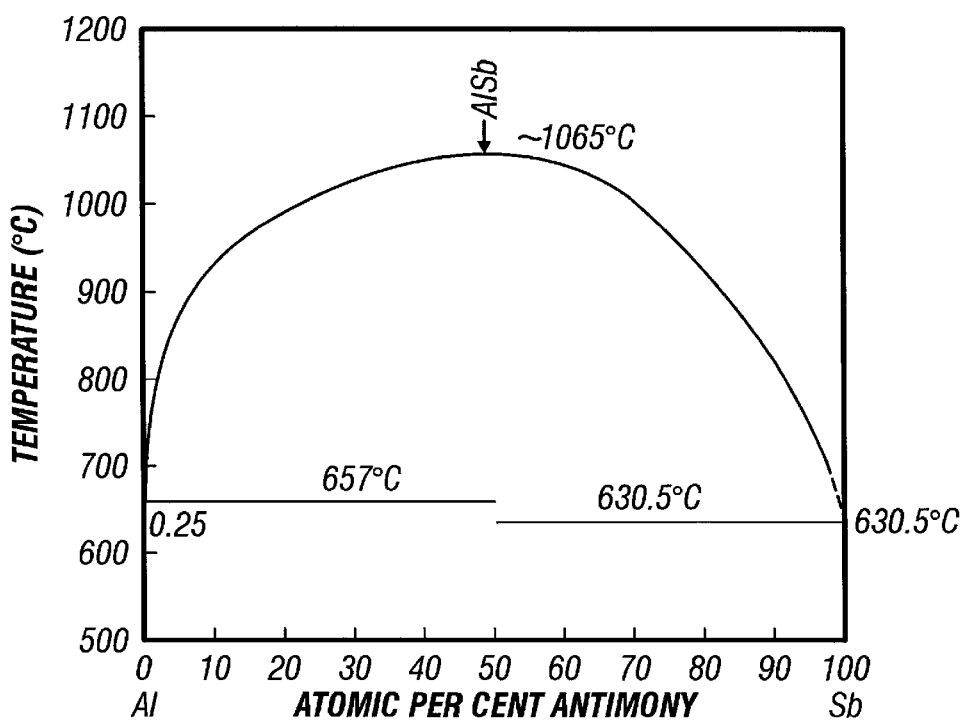
FIG. 13 is a diagram showing phases of a binary system consisting of aluminum and antimony.
Figure 14A:
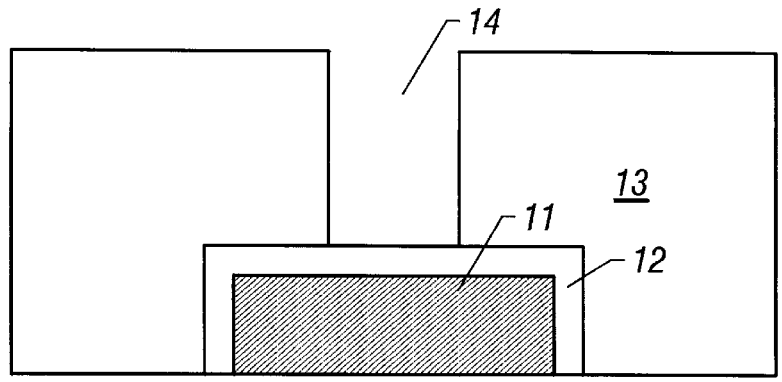
FIGS. 14(A) to 14(C) are a view showing a conventional structure in which TFT interconnects are connected.
Figure 14B:
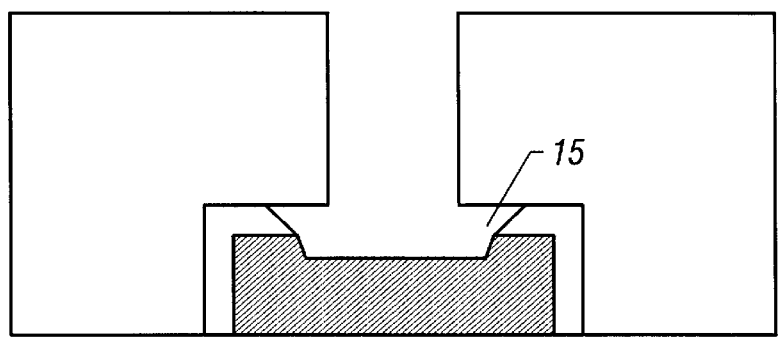
Figure 14C:
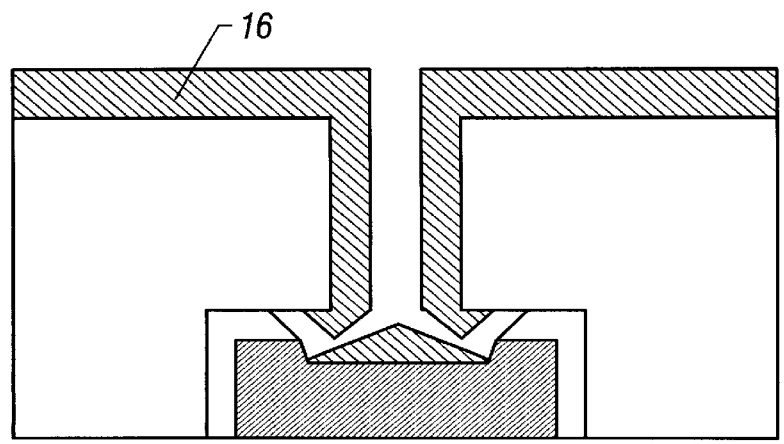

Although the alloy of aluminum and antimony does not assume a liquid phase at 450° C. in FIG. 13, the invention can be applied to this alloy for the above-described reason.

EMBODIMENT 6

The present embodiment depicts an example in which the heat treatment adopted by the reflow step is RTA (rapid thermal annealing). Since the process sequence for the TFTs of the present embodiment is similar to that of Embodiment 2, the process sequence is not described below.

The RTA is an annealing method for directing infrared light, ultraviolet radiation, or other intense light against a body to be treated. This method is characterized in that the ramp-up rate and ramp-down rate are high and the processing time is as short as several seconds to tens of seconds. Therefore, virtually the top thin film alone can be heated. For example, only a thin film on a glass substrate can be annealed at a quite high temperature of about 1000° C.

In the apparatus shown in FIG. 1, infrared lamps are installed in the heating chamber 108. Substrates carried into this chamber are subjected to RTA.

Since the RTA processing is conducted for a quite short time of several seconds to tens of seconds, the time required for the reflow step can be reduced greatly compared with the processing using a heater. In this way, the RTA processing is very effective in enhancing the productivity.

Where the gate electrode is made of aluminum, the reflow step utilizing heating that depends on a heater must be carried out at a low temperature below 450° C., taking the heat resistance of aluminum into consideration.

However, where the RTA technique described in the present embodiment is applied, it is not necessary to take account of the heat resistance of the gate electrode. This extends the tolerated range of reflow temperatures.

That is, the element added to the interconnect electrodes and its concentration can be selected from more kinds and wider ranges of concentrations.

The present invention assures good reflowing of the film consisting only or chiefly of aluminum. As a result, this aluminum-based film certainly makes contact with the underlying active layer or gate electrodes via contact holes. Consequently, the reliabilities of fabricated TFTs, circuits using them, and liquid crystal displays using them are enhanced greatly. Also, the fabrication yield can be improved.

What is claimed is:

1. A method of fabricating a semiconductor device, comprising the steps of:

preparing first and second reaction chambers, wherein said first and second reaction chambers are isolated from each other;

forming a conductive film comprising aluminum over a substrate in said first reaction chamber; and supplying energy to said conductive film in said second reaction chamber to impart fluidity to at least a part of said conductive film.

2. A method according to claim 1, wherein said first and second reaction chambers are connected together via a hermetic substrate conveyance chamber whose ambient can be controlled independently, and wherein said substrate is passed through said substrate conveyance chamber when said substrate is conveyed from said first reaction chamber to said second reaction chamber.

3. A method according to claim 1, wherein said film is formed by sputtering.

4. A method of fabricating a semiconductor device, comprising the steps of:

preparing first and second reaction chambers, wherein said first and second reaction chambers are isolated from each other;

forming a conductive film comprising aluminum and containing an element for imparting fluidity to said conductive film over a substrate in said first reaction chamber; and supplying energy to said conductive film in said second reaction chamber to impart fluidity to at least a part of said conductive film.

5. A method according to claim 4, wherein said element for imparting fluidity to said conductive film is one or more elements belonging to Groups 12–15 of the periodic table.

6. A method according to claim 4, wherein said element for imparting fluidity to said conductive film is one or more elements selected from the group consisting of germanium (Ge), tin (Sn), gallium (Ga), zinc (Zn), lead (Pb), indium (In), and antimony (Sb).

7. A method according to claim 1, wherein said first and second reaction chambers are connected together via an isolated substrate conveyance chamber whose ambient can be controlled independently, and wherein said substrate is passed through said substrate conveyance chamber when said substrate is conveyed from said first reaction chamber to said second reaction chamber.

8. A method of fabricating a semiconductor device, comprising the steps of:

preparing first, second, and third reaction chambers, wherein said first through third reaction chambers are isolated from each other;

forming a first film containing an element for imparting fluidity to a second film comprising aluminum over a substrate in said first reaction chamber;

forming said second film on said first film in said second reaction chamber; and supplying energy to said second film in said third reaction chamber to impart fluidity to at least a part of said second film.

9. A method according to claim 8, wherein said first, second, and third reaction chambers are connected together via an isolated substrate conveyance chamber whose ambient can be controlled independently, and wherein said substrate is passed through said substrate conveyance chamber when the substrate is conveyed from said first reaction chamber to said second reaction chamber and from said second reaction chamber to said third reaction chamber.

10. A method according to claim 8 wherein said first and second films are formed by sputtering respectively.

11. A method according to claim 8, wherein said element for imparting fluidity to said second film is one or more elements belonging to Groups 12–15 of the periodic table.

12. A method according to claim 8, wherein said element for imparting fluidity to said second film is one or more elements selected from the group consisting of germanium (Ge), tin (Sn), gallium (Ga), zinc (Zn), lead (Pb), indium (In), and antimony (Sb).

13. A method of fabricating a semiconductor device, comprising the steps of:

preparing first, second, and third reaction chambers, wherein said first through third reaction chambers are isolated from each other;

forming a first film comprising aluminum in said first reaction chamber;

forming a second film containing an element for imparting fluidity to said first film on said first film in said second reaction chamber; and supplying energy to said first film in said third reaction chamber to impart fluidity to at least a part of said first film.

14. A method according to claim 13 wherein said first and second films are formed by sputtering respectively.

15. A method according to claim 13, wherein said element for imparting fluidity to said first film is one or more elements belonging to Groups 12–15 of the periodic table.

16. A method according to claim 13, wherein said element for imparting fluidity to said first film is one or more elements selected from the group consisting of germanium (Ge), tin (Sn), gallium (Ga), zinc (Zn), lead (Pb), indium (In), and antimony (Sb).

17. A method of fabricating a semiconductor device, comprising the steps of:

forming an interlayer dielectric film having contact holes;

forming a conductive film comprising aluminum without being exposed to the air in such a way that said conductive film is electrically connected with at least a part of the semiconductor device via said contact holes; and performing a heat treatment without being exposed to the air to substantially reflow said conductive film.

18. A method according to claim 17 wherein said conductive film is formed by sputtering.

19. A method according to claim 1 further comprising a step of patterning said conductive film to form a wiring after supplying of said energy.

20. A method according to claim 4 further comprising a step of patterning said conductive film to form a wiring after supplying of said energy.

21. A method according to claim 8 further comprising a step of patterning said first and said second films to form a wiring after supplying of said energy.

22. A method according to claim 13 further comprising a step of patterning said first and said second films to form a wiring after supplying of said energy.

23. A method according to claim 17 further comprising a step of patterning said conductive film to form a wiring after supplying of said energy.

24. A method for manufacturing a semiconductor device comprising steps of:

preparing at least one semiconductor element;

forming an interlayer insulating film over said semiconductor element;

forming a conductive film comprising aluminum wherein said conductive film is electrically connected to said semiconductor element through a contact hole of said interlayer insulating film; and supplying energy to said conductive film to impart a fluidity to said conductive film, wherein a surface of said conductive film is not exposed to the air before the supplying of said energy.

25. A method according to claim 24 wherein said semiconductor element is a thin film transistor.

26. A method according to claim 24 wherein said energy is supplied by heating at a temperature less than 450° C.

27. A method according to claim 24 wherein said energy is supplied by a light selected from the group consisting of infrared light and ultraviolet light.

28. A method according to claim 24 further comprising a step of patterning said conductive film to form a wiring after supplying of said energy.

29. A method for manufacturing a semiconductor device comprising steps of:

preparing at least one semiconductor element;

forming an interlayer insulating film over said semiconductor element;

forming a conductive film comprising aluminum and an element for imparting fluidity to said conductive film wherein said conductive film is electrically connected to said semiconductor element through a contact hole of said interlayer insulating film; and supplying energy to said conductive film to impart a fluidity to said conductive film.

30. A method according to claim 29 wherein said semiconductor element is a thin film transistor.

31. A method according to claim 29 wherein said energy is supplied by heating at a temperature less than 450° C.

32. A method according to claim 29 wherein said energy is supplied by a light selected from the group consisting of infrared light and ultraviolet light.

33. A method according to claim 29 further comprising a step of patterning said conductive film to form a wiring after supplying of said energy.

34. A method according to claim 29 wherein said element for imparting fluidity to said conductive film is one or more elements belonging to Groups 12–15 of the periodic table.

35. A method according to claim 29 wherein said element for imparting fluidity to said conductive film is one or more elements selected from the group consisting of germanium (Ge), tin (Sn), gallium (Ga), zinc (Zn), lead (Pb), indium (In), and antimony (Sb).

36. A method for manufacturing a semiconductor device comprising steps of:

preparing at least one semiconductor element;

forming an interlayer insulating film over said semiconductor element;

forming a conductive film comprising aluminum wherein said conductive film is electrically connected to said semiconductor element through a contact hole of said interlayer insulating film;

disposing an element for imparting fluidity to said conductive film in contact with said conductive film; and supplying energy to said conductive film to impart a fluidity to said conductive film.

37. A method according to claim 36 wherein said semiconductor element is a thin film transistor.

38. A method according to claim 36 wherein said energy is supplied by heating at a temperature less than 450° C.

39. A method according to claim 36 wherein said energy is supplied by a light selected from the group consisting of infrared light and ultraviolet light.

40. A method according to claim 36 further comprising a step of patterning said conductive film to form a wiring after supplying of said energy.

41. A method according to claim 36 wherein said element for imparting fluidity to said conductive film is one or more elements belonging to Groups 12–15 of the periodic table.

42. A method according to claim 36 wherein said element for imparting fluidity to said conductive film is one or more elements selected from the group consisting of germanium (Ge), tin (Sn), gallium (Ga), zinc (Zn), lead (Pb), indium (In), and antimony (Sb).

43. A method for manufacturing a semiconductor device comprising steps of:

preparing at least one semiconductor element;

forming an interlayer insulating film over said semiconductor element;

forming a conductive film comprising aluminum and an element for imparting fluidity to said conductive film wherein said conductive film is electrically connected to said semiconductor element through a contact hole of said interlayer insulating film; and supplying energy to said conductive film to impart a fluidity to said conductive film, wherein a surface of said conductive film is not exposed to the air before the supplying of said energy.

44. A method according to claim 43 wherein said semiconductor element is a thin film transistor.

45. A method according to claim 43 wherein said energy is supplied by heating at a temperature less than 450° C.

46. A method according to claim 45 wherein said energy is supplied by a light selected from the group consisting of infrared light and ultraviolet light.

47. A method according to claim 43 further comprising a step of patterning said conductive film to form a wiring after supplying of said energy.

48. A method according to claim 43 wherein said element for imparting fluidity to said conductive film is one or more elements belonging to Groups 12–15 of the periodic table.

49. A method according to claim 43 wherein said element for imparting fluidity to said conductive film is one or more elements selected from the group consisting of germanium (Ge), tin (Sn), gallium (Ga), zinc (Zn), lead (Pb), indium (In), and antimony (Sb).

50. A method for manufacturing a semiconductor device comprising steps of:

forming a first wiring;

forming an interlayer insulating film over said first wiring;

forming a conductive film comprising aluminum wherein said conductive film is electrically connected to said first wiring through a contact hole of said interlayer insulating film; and supplying energy to said conductive film to impart a fluidity to said conductive film, wherein a surface of said conductive film is not exposed to the air before the supplying of said energy.

51. A method according to claim 50 wherein said energy is supplied by heating at a temperature less than 450° C.

52. A method according to claim 50 wherein said energy is supplied by a light selected from the group consisting of infrared light and ultraviolet light.

53. A method according to claim 50 further comprising a step of patterning said conductive film to form a second wiring after supplying of said energy.

54. A method for manufacturing a semiconductor device comprising steps of:

forming a first wiring;

forming an interlayer insulating film over said first wiring;

forming a conductive film comprising aluminum and an element for imparting fluidity to said conductive film wherein said conductive film is electrically connected to said first wiring through a contact hole of said interlayer insulating film; and supplying energy to said conductive film to impart a fluidity to said conductive film.

55. A method according to claim 54 wherein said energy is supplied by heating at a temperature less than 450° C.

56. A method according to claim 54 wherein said energy is supplied by a light selected from the group consisting of infrared light and ultraviolet light.

57. A method according to claim 54 further comprising a step of patterning said conductive film to form a second wiring after supplying of said energy.

58. A method according to claim 54 wherein said element for imparting fluidity to said conductive film is one or more elements belonging to Groups 12–15 of the periodic table.

59. A method according to claim 54 wherein said element for imparting fluidity to said conductive film is one or more elements selected from the group consisting of germanium (Ge), tin (Sn), gallium (Ga), zinc (Zn), lead (Pb), indium (In), and antimony (Sb).

60. A method for manufacturing a semiconductor device comprising steps of:

forming a first wiring;

forming an interlayer insulating film over said first wiring;

forming a conductive film comprising aluminum wherein said conductive film is electrically connected to said first wiring through a contact hole of said interlayer insulating film;

disposing an element for imparting fluidity to said conductive film in contact with said conductive film; and supplying energy to said conductive film to impart a fluidity to said conductive film.

61. A method according to claim 60 wherein said energy is supplied by heating at a temperature less than 450° C.

62. A method according to claim 60 wherein said energy is supplied by a light selected from the group consisting of infrared light and ultraviolet light.

63. A method according to claim 60 further comprising a step of patterning said conductive film to form a second wiring after supplying bf said energy.

64. A method according to claim 60 wherein said element for imparting fluidity to said conductive film is one or more elements belonging to Groups 12–15 of the periodic table.

65. A method according to claim 60 wherein said element for imparting fluidity to said conductive film is one or more elements selected from the group consisting of germanium (Ge), tin (Sn), gallium (Ga), zinc (Zn), lead (Pb), indium (In), and antimony (Sb).

66. A method for manufacturing a semiconductor device comprising steps of:

forming a first wiring;

forming an interlayer insulating film over said first wiring;

forming a conductive film comprising aluminum and an element for imparting fluidity to said conductive film wherein said conductive film is electrically connected to said first wiring through a contact hole of said interlayer insulating film; and supplying energy to said conductive film to impart a fluidity to said conductive film, wherein a surface of said conductive film is not exposed to the air before the supplying of said energy.

67. A method according to claim 66 wherein said energy is supplied by heating at a temperature less than 450° C.

68. A method according to claim 66 wherein said energy is supplied by a light selected from the group consisting of infrared light and ultraviolet light.

69. A method according to claim 66 further comprising a step of patterning said conductive film to form a second wiring after supplying of said energy.

70. A method according to claim 66 wherein said element for imparting fluidity to said conductive film is one or more elements belonging to Groups 12–15 of the periodic table.

71. A method according to claim 66 wherein said element for imparting fluidity to said conductive film is one or more elements selected from the group consisting of germanium (Ge), tin (Sn), gallium (Ga), zinc (Zn), lead (Pb), indium (In), and antimony (Sb).

* * * * *